(12) United States Patent
Shimizu et al.

(10) Patent No.: US 9,390,907 B2
(45) Date of Patent: Jul. 12, 2016

(54) FILM FORMING METHOD OF SICN FILM

(71) Applicants: TOKYO ELECTRON LIMITED, Tokyo (JP); UBE INDUSTRIES, LTD., Ube-shi, Yamaguchi (JP)

(72) Inventors: Akira Shimizu, Nirasaki (JP); Takahiro Miyahara, Nirasaki (JP); Masashi Shirai, Ube (JP); Shinichiro Sadaike, Ube (JP)

(73) Assignees: TOKYO ELECTRON LIMITED, Tokyo (JP); UBE INDUSTRIES, LTD., Ube-Shi, Yamaguchi (JP)

( * ) Notice: Subject to any disclaimer, the term of this patent is extended or adjusted under 35 U.S.C. 154(b) by 0 days.

(21) Appl. No.: 14/725,147

(22) Filed: May 29, 2015

(65) Prior Publication Data

US 2015/0348778 A1     Dec. 3, 2015

(30) Foreign Application Priority Data

May 30, 2014     (JP) .................................. 2014-112439

(51) Int. Cl.
*H01L 21/31*     (2006.01)
*H01L 21/02*     (2006.01)

(52) U.S. Cl.
CPC ...... *H01L 21/02167* (2013.01); *H01L 21/0217* (2013.01); *H01L 21/0228* (2013.01)

(58) Field of Classification Search
CPC .......................... H01L 21/0127; H01L 21/0228
USPC ........................................................ 438/786
See application file for complete search history.

(56) References Cited

U.S. PATENT DOCUMENTS

2006/0110931 A1*  5/2006  Fukazawa ............. C23C 16/401
                                                  438/758
2010/0167024 A1*  7/2010  Natsume ............... G03F 7/0757
                                                  428/195.1

FOREIGN PATENT DOCUMENTS

| JP | 2006287194 A | 10/2006 |
| JP | 2007189173 A | 7/2007 |
| JP | 2008227460 A | 9/2008 |
| JP | 2009065203 A | 3/2009 |
| JP | 2012023399 A | 2/2012 |
| JP | 2013021301 A | 1/2013 |

* cited by examiner

*Primary Examiner* — Long K Tran
(74) *Attorney, Agent, or Firm* — Nath, Goldberg & Meyer; Jerald L. Meyer

(57) ABSTRACT

A method of forming an SiCN film on a surface to be processed of an object, the method including: supplying an Si source gas containing an Si source into a processing chamber having the object accommodated therein; and supplying a gas containing a nitriding agent into the processing chamber after supplying the Si source gas, wherein a compound of nitrogen and carbon is used as the nitriding agent and wherein $R^1$, $R^2$ and $R^3$ in the compound of nitrogen and carbon are linear or branched alkyl groups having 1 to 8 carbon atoms, which may have hydrogen atoms or substituents. Therefore, the SiCN film can be formed while maintaining a satisfactory film forming rate even though the film forming temperature is lowered.

6 Claims, 9 Drawing Sheets

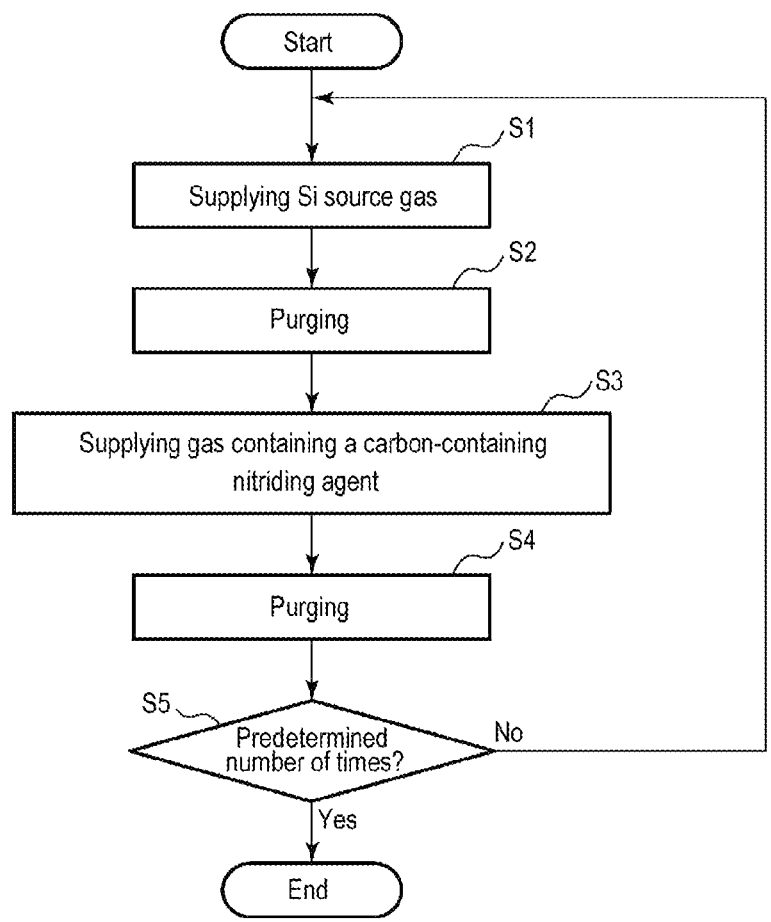

------ : Cleavage portions 1,2,3-triazole-based compound

FILM FORMING METHOD OF SICN FILM

CROSS-REFERENCE TO RELATED APPLICATION

This application claims the benefit of Japanese Patent Application No. 2014-112439, filed on May 30, 2014, in the Japan Patent Office, the disclosure of which is incorporated herein in its entirety by reference.

TECHNICAL FIELD

The present disclosure relates to a film forming method of an SiCN film.

BACKGROUND

A silicon oxide film ($SiO_2$ film) and a silicon nitride film (SiN film) are well known as insulating films of a semiconductor integrated circuit device. The SiN film has a specific permittivity higher than that of the $SiO_2$ film and can take an etching selection ratio with respect to the $SiO_2$ film or silicon (Si). For this reason, the SiN film is used at a portion where a permittivity higher than that of the $SiO_2$ film is needed, or is used as an etching stopper layer for the $SiO_2$ film or Si or as a hard mask layer used in processing the $SiO_2$ film or Si.

A film forming apparatus used in manufacturing a semiconductor integrated circuit device is generally classified into a single type film forming apparatus for processing wafers one by one and a batch type film forming apparatus for processing a plurality of wafers at a time. The batch type film forming apparatus includes a vertical batch type film forming apparatus capable of processing a larger number of wafers at a time. The film forming temperature when the SiN film is formed using the vertical batch type film forming apparatus is about 630 degrees C. to 760 degrees C.

Meanwhile, miniaturization of the semiconductor integrated circuit device is further advanced. In a process of manufacturing the semiconductor integrated circuit device, a process at low temperature is required to achieve the miniaturization of the semiconductor integrated circuit device.

In order to form the SiN film at low temperature, a nitriding agent contained in a nitride gas, for example, ammonia ($NH_3$), is used as an active nitride species such as ammonia radicals by using plasma. By using the active nitride species, the nitridation of an Si film on a wafer can be accelerated even under low temperature conditions. However, if the Si film is nitrided using the nitriding agent in a plasma state, the chemical resistance of the formed SiN film deteriorates. Specifically, the SiN film is easily etched by a diluted hydrofluoric acid solution (hereinafter, referred to as a diluted HF solution). Therefore, a method is used in which a silicon carbonitride film (hereinafter, referred to as an SiCN film) is formed by adding carbon (C) to an SiN film to improve the chemical resistance of the SiCN film as compared with the SiN film.

In this method, as an SiC film is nitrided using active nitride species produced using plasma, the SiCN film is formed. For this reason, although the film forming temperature is lowered to a temperature zone of less than 630 degrees C., it is possible to obtain a sufficient film forming rate that can be actually used. However, if there is a microstructure having steps on a surface to be processed of a wafer, for example, a trench, it is difficult to form a film on a sidewall of a lower portion of the trench. This is because active nitride species, for example, ammonia radicals or the like, contact the sidewall of the trench and are then deactivated, so that active ammonia radicals do not make sufficient contact with the lower portion of the trench.

In this regard, a method of nitriding an SiC film without using plasma is used. Accordingly, it is possible to obtain an advantage in that a film is easily formed on a lower portion of a trench as compared with the conventional method.

However, the SiC film is nitrided without using plasma in this method. Thus, if the film forming temperature is lowered, for example, to a temperature zone of less than 630 degrees C., the film forming rate is rapidly reduced as compared with the case using plasma.

SUMMARY

Some embodiments of the present disclosure provide a film forming method of an SiCN film, in which the SiCN film can be formed while maintaining a satisfactory film forming rate even though the film forming temperature is lowered.

According to one embodiment of the present disclosure, there is provided a method of forming an SiCN film on a surface to be processed of an object to be processed, the method including: supplying an Si source gas containing an Si source into a processing chamber having the object to be processed accommodated therein; and supplying a gas containing a nitriding agent into the processing chamber after supplying the Si source gas, wherein a compound of nitrogen and carbon, which is represented by the following Chemical Formula 1, is used as the nitriding agent:

[Chemical Formula 1]

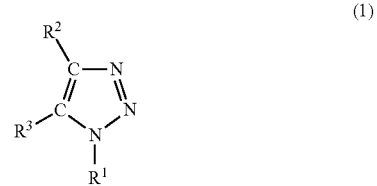

(1)

wherein $R^1$, $R^2$ and $R^3$ are linear or branched alkyl groups having 1 to 8 carbon atoms, which may have hydrogen atoms or substituents.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart illustrating an example of a film forming method of an SiCN film according to a first embodiment of the present disclosure.

DETAILED DESCRIPTION

Figure 2A:
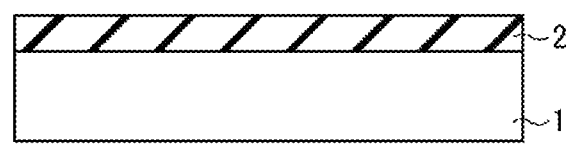
FIGS. 2A to 2F are sectional views illustrating a state of an object to be processed in the sequence shown in FIG. 1.

Hereinafter, some embodiments of the present disclosure will be described with reference to the accompanying drawings. Throughout the drawings, like reference numerals are used to designate like elements. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

<Film Forming Method>

FIG. 1 is a flowchart illustrating an example of a film forming method of an SiCN film according to a first embodiment of the present disclosure. FIGS. 2A to 2F are sectional views illustrating a state of an object to be processed in the sequence shown in FIG. 1.

First, an object to be processed is prepared as shown in FIG. 2A. In this example, a silicon wafer (hereinafter, referred to as a wafer) 1 was used as the object to be processed. An $SiO_2$ film 2 is formed on the wafer 1. In this example, a surface of the $SiO_2$ film 2 is a surface to be processed. An SiCN film is formed on the $SiO_2$ film 2 that is the surface to be processed. In addition, the surface to be processed of the wafer 1 is not limited to the $SiO_2$ film 2, and may be a film on which the SiCN film is formed. It will be apparent that the surface itself of the wafer 1 may be the surface to be processed. Thereafter, the wafer 1 shown in FIG. 2A is accommodated in a processing chamber of a film forming apparatus.

Figure 2B:
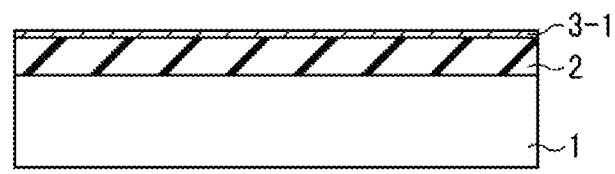

Subsequently, as shown in Step S1 of FIG. 1 and FIG. 2B, an Si source gas is supplied onto the $SiO_2$ film 2 in the processing chamber, thereby forming an Si film 3-1 on the $SiO_2$ film 2. In this example, hexachlorodisilane (HCD) is used as the Si source gas. It will be apparent that the Si source gas is not limited to HCD.

An example of processing conditions in Step S1 is as follows:

Flow Rate of HCD: 100 sccm
Film Forming Time 0.5 min (per cycle)
Film Forming Temperature: 550 degrees C.
Film Forming Pressure: 133.32 Pa (1 Torr).

Subsequently, as shown in Step S2 of FIG. 1, after the inside of the processing chamber of the film forming apparatus is exhausted, an inert gas, for example, $N_2$ gas is supplied into the processing chamber to purge the inside thereof.

Figure 2C:
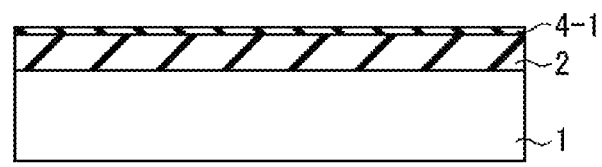

Subsequently, as shown in Step S3 of FIG. 1 and FIG. 2C, a gas containing a carbon-containing nitriding agent is supplied onto the Si film 3-1, thereby adding carbon (C) to the Si film 3-1 while nitriding the Si film 3-1. Accordingly, the Si film 3-1 becomes an SiCN film. In this example, a compound of carbon and nitrogen represented by the following Chemical Formula 1 is used as the carbon-containing nitriding agent.

[Chemical Formula 1]

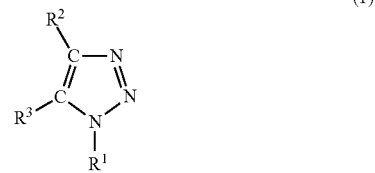

The compound represented by Chemical Formula 1 is a 1,2,3-triazole-based compound, wherein $R^1$, $R^2$ and $R^3$ are linear or branched alkyl groups having 1 to 8 carbon atoms, which may have hydrogen atoms or substituents.

Specifically, the linear or branched alkyl group having 1 to 8 carbon atoms is a methyl group, an ethyl group, an n-propyl group, an isopropyl group, an n-butyl group, an isobutyl group, a t-butyl group, an n-pentyl group, an isopentyl group, a t-pentyl group, an n-hexyl group, an isohexyl group, a t-hexyl group, an n-heptyl group, an isoheptyl group, a t-heptyl group, an n-octyl group, an isooctyl group or a t-octyl group. In some embodiments, the linear or branched alkyl group is a methyl group, an ethyl group or an n-propyl group. In other embodiments, the linear or branched alkyl group is a methyl group.

The substituent may be a linear or branched monoalkylamino or dialkylamino group substituted with an alkyl group having 1 to 4 carbon atoms. Specifically, the substituent is a monomethylamino group, a dimethylamino group, a monoethylamino group, a diethylamino group, a monopropylamino group, a monoisopropylamino group, or an ethylmethylamino group. In some embodiments, the substituent is a monomethylamino group or a dimethylamino group. In other embodiments, the substituent is a dimethylamino group.

The substituent may be a linear or branched alkoxy group having 1 to 8 carbon atoms. Specifically, the substituent is a methoxy group, an ethoxy group, a propoxy group, a butoxy group, a pentoxy group, a hexyloxy group, a heptyloxy group, or an octlyoxy group. In some embodiments, the substituent is a methoxy group, an ethoxy group or a propoxy group. In other embodiments, the substituent is a methoxy group.

An example of the specific compound represented by Chemical Formula 1 is 1H-1,2,3-triazole, 1-methyl-1,2,3-triazole, 1,4-dimethyl-1,2,3-triazole, 1,4,5-trimethyl-1,2,3-triazole, 1-ethyle-1,2,3-triazole, 1,4-diethyl-1,2,3-triazole, or 1,4,5-triethyl-1,2,3-triazole. The compound may be used solely, or two or more of the compounds may be used in combination.

In this example, 1H-1,2,3-triazole was used as the carbon-containing nitriding agent. An example of processing conditions in Step S3 is as follows:

Flow Rate of Triazole: 100 sccm
Processing Time 0.5 min (per cycle)
Processing Temperature: 550 degrees C.
Processing Pressure: 133.32 Pa (1 Torr).

Subsequently, as shown in Step S4 of FIG. 1, after the inside of the processing chamber of the film forming apparatus is exhausted, an inert gas, for example, $N_2$ gas is supplied into the processing chamber to purge the inside thereof.

Subsequently, as shown in Step S5 of FIG. 1, it is determined whether the number of times of processing is a predetermined number of times. If the number of times of processing reaches the predetermined number of times ("Yes"), the formation of the SiCN film is terminated.

Figure 2D:
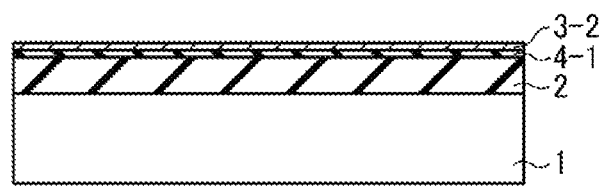
Figure 2E:
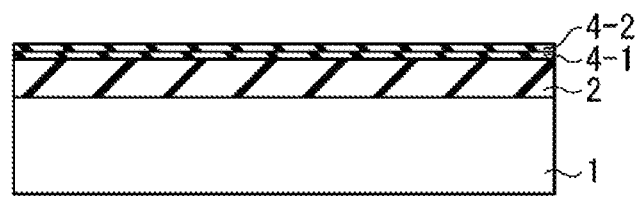

If the number of times of processing does not reach the predetermined number of times ("No"), by repeating Steps S1 to S4, a second time Si film 3-2 is formed on the SiCN film 4-1 as shown in FIG. 2D. Further, a second time SiCN film 4-2 is formed by adding C to the second Si film 3-2 while nitriding the second time Si film 3-2.

Figure 2F:
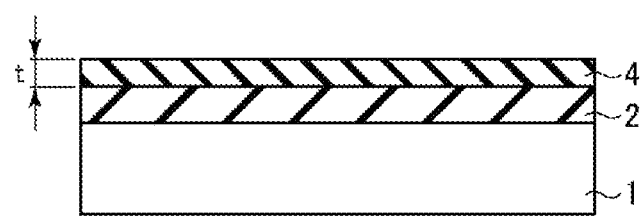

In this manner, Steps S1 to S4 are repeated the predetermined number of times, so that an SiCN film 4 having a designed thickness t is formed as shown in FIG. 2F.

<Atomic Composition of SiCN Film>

Figure 3:
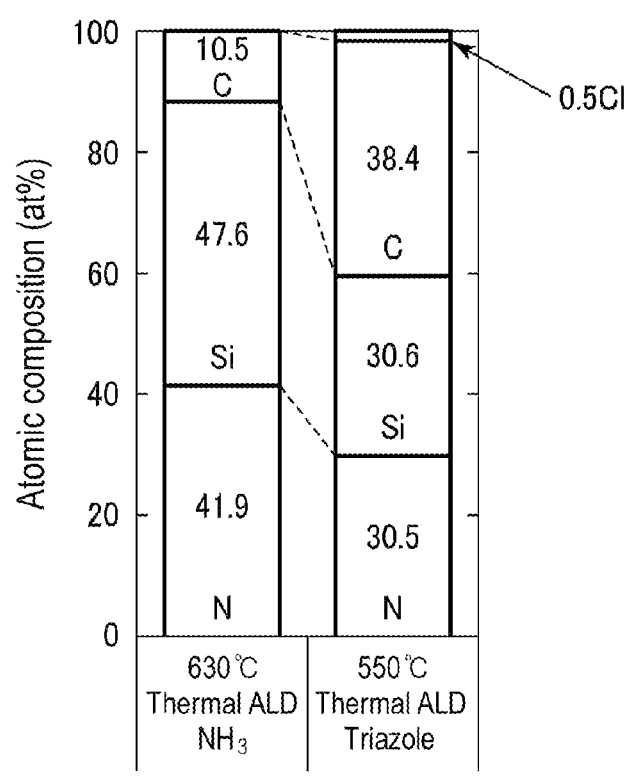
FIG. 3 illustrates atomic compositions of SiCN films.

FIG. 3 illustrates atomic compositions of SiCN films. In FIG. 3, in addition to an atomic composition of the SiCN film formed by the film forming method according to the first embodiment, an atomic composition of an SiCN film is shown as a reference example, the SiCN film formed by a thermal ALD method at a film forming temperature of 630 degrees C., using dichlorosilane (DCS) as an Si source gas, $NH_3$ as a nitriding agent, and ethylene ($C_2H_4$) as a carbonizing agent.

As shown in FIG. 3, the atomic composition of the SiCN film as the reference example is as follows: N=41.9 at %, Si=47.6 at % and C=10.5 at %. According to the reference example, although C is added, the amount of C is less than that of Si or N. According to the reference example, an Si-rich (or N-rich) SiCN film is formed.

On the contrary, the atomic composition of the SiCN film formed by the film forming method according to the first embodiment is as follows: N=30.5 at %, Si=30.6 at % and C=38.4 at %. A C-rich SiCN film in which the amount of C is more than that of Si or N is formed. Also, chlorine (Cl) of 0.5 at %, which is a small amount, was detected from the SiCN film formed by the film forming method according to the first embodiment. Cl is originated from HCD that is the Si source gas.

According to the SiCN film formed by the film forming method according to the first embodiment, it is possible to form a C-rich SiCN film in which the amount of C is more than that of Si or N, as compared with the reference example. It will be apparent that the added amount of C may be adjusted by adjusting the flow rate of 1H-1,2,3-triazole. That is, according to the film forming method according to the first embodiment, it is possible to more extensively control the added amount of C as compared with the reference example. For example, the added amount of C influences the chemical resistance of the SiCN film. The more extensive controllability of the added amount of C makes it possible to form an SiCN film having more excellent chemical resistance as compared with the reference example.

<Chemical Resistance of SiCN Film>

Figure 4:
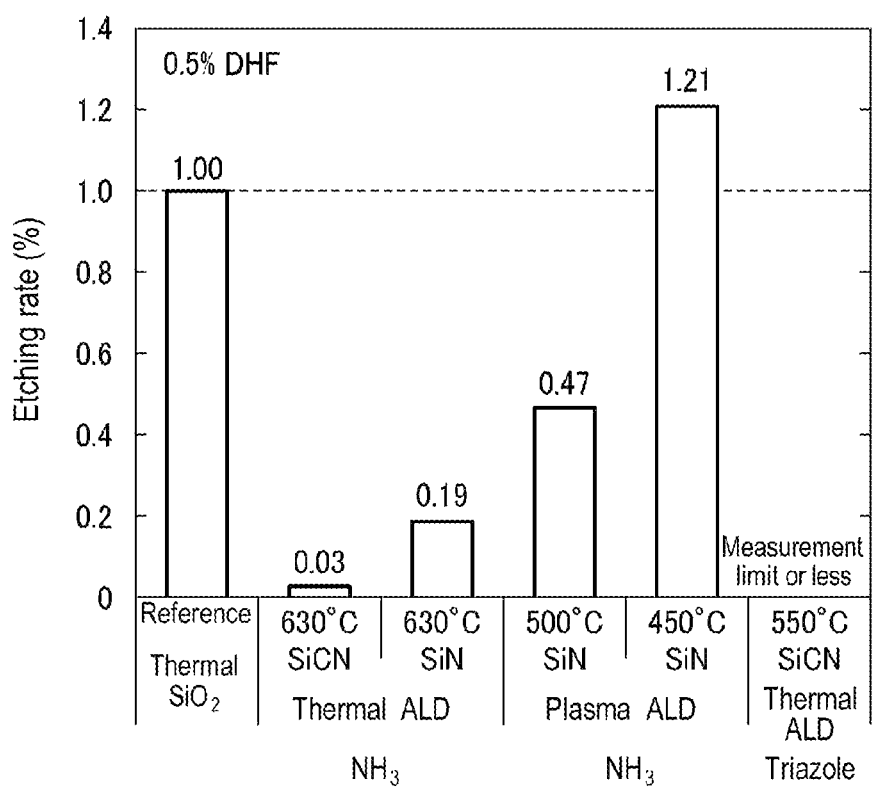
FIG. 4 illustrates etching rates of SiN and SiCN films.

FIG. 4 illustrates etching rates of SiN and SiCN films. In FIG. 4, 0.5% DHF is used as an etchant, and a ratio of etching rates of SiN and SiCN films is shown when the etching rate of a thermal $SiO_2$ film is set to a reference value of 1.0 (100%).

First, an etching rate of an SiN film will be described.

The etching rate of an SiN film formed by a plasma ALD method at a film forming temperature of 500 degrees C., using DCS as the Si source gas and $NH_3$ as the nitriding agent, for the 0.5% DHF, is 0.47 (47%) as compared with the reference value, which is about a half of the etching rate of the thermal $SiO_2$ film. However, if the film forming temperature is decreased to 450 degrees C., the etching rate of the SiN film for the 0.5% DHF becomes 1.21 (121%) as compared with the reference value, which is higher than that of the thermal $SiO_2$ film. As described above, the SiN film formed by the plasma ALD method has unsatisfactory chemical resistance, specifically, unsatisfactory resistance against the 0.5% DHF.

In addition, according to an SiN film formed by the thermal ALD method at a film forming temperature of 630 degrees C., using DCS as the Si source gas and $NH_3$ as the nitriding agent, the etching rate of the SiN film for the 0.5% DHF is 0.19 (19%) as compared with the reference value, which can be improved up to about ⅕ of the etching rate of the thermal $SiO_2$ film. The film forming temperature of the SiN film formed by the plasma ALD method shown in FIG. 4 is 630 degrees C., which is higher than the film forming temperature of 450 degrees C. to 500 degrees C. at which the SiN film is formed by the plasma ALD method shown in FIG. 4 in the same manner. For this reason, the comparison is not made at the same film forming temperature. Though generally speaking, the film forming temperature may be advantageously high in order to increase the chemical resistance of the SiN film, and the thermal ALD method may be more advantageous than the plasma ALD method. It is certain that in FIG. 4, the SiN film formed by the thermal ALD method at a high temperature of 630 degrees C. has further improved resistance for the 0.5% DHF than the SiN film formed by the plasma ALD method at a low temperature of 450 degrees C. to 500 degrees C.

According to an SiCN film which is formed by the thermal ALD method at a film forming temperature 630 degrees C., using DCS as the Si source gas and $NH_3$ as the nitriding agent, and has C added thereto, the etching rate of the SiCN film for the 0.5% DHF is 0.03 (3%) as compared with the reference value. That is, the SiCN film formed by the thermal ALD method has chemical resistance much higher than the SiN formed by the thermal ALD method.

In addition, according to the SiCN film formed by the film forming method according to the first embodiment, the etching rate of the SiCN film for the 0.5% DHF becomes a measurement limit or less, which falls below 0.03 (3%), resulting in the SiCN film being hardly etched for the 0.5% DHF. Furthermore, the film forming temperature of the SiCN film formed by the film forming method according to the first embodiment is 550 degrees C. lower than 630 degrees C.

As described above, according to the film forming method of the first embodiment, it is possible to obtain an SiCN film having a chemical resistance much higher than that of the SiCN film formed by the thermal ALD method, using DCS as the Si source gas and $NH_3$ as the nitriding agent.

<Film Forming Rate of SiCN Film>

Figure 5:
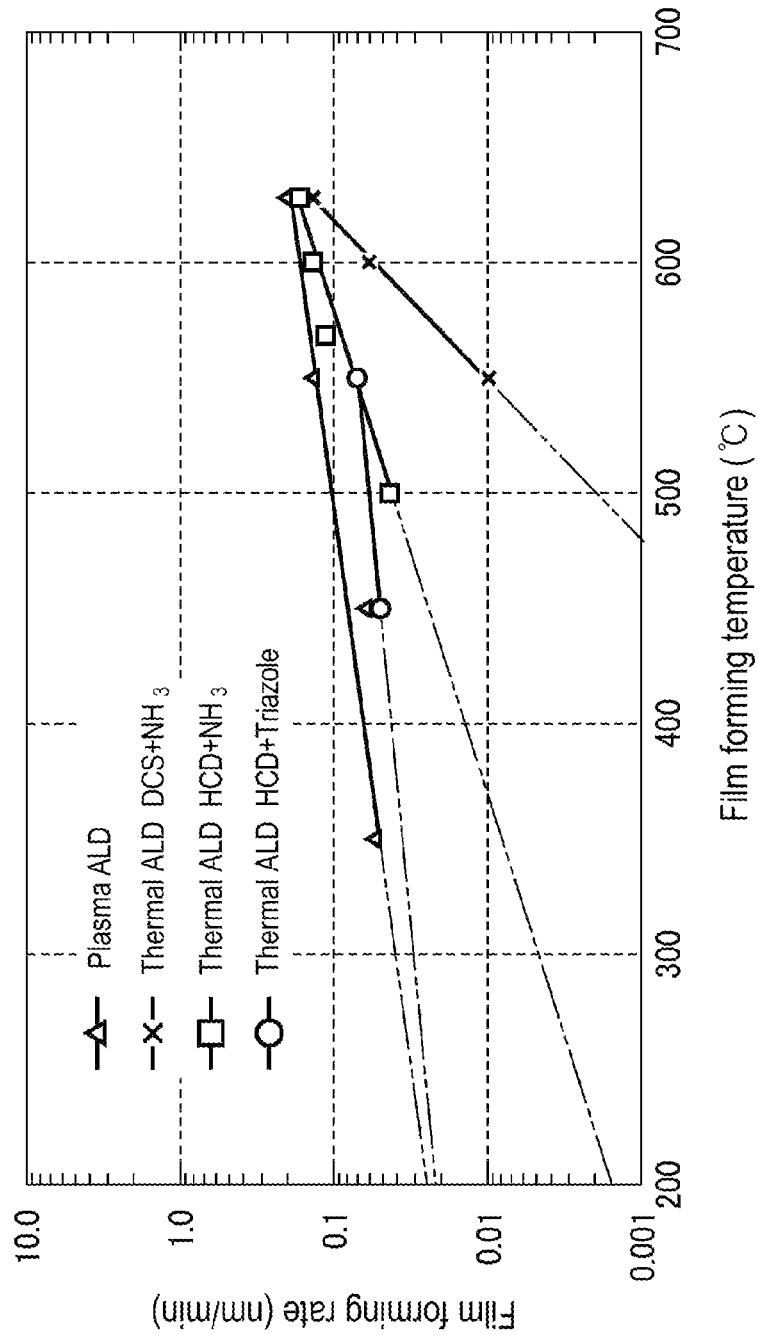
FIG. 5 illustrates a relationship between a film forming temperature and a film forming rate of SiN and SiCN films.

FIG. 5 illustrates a relationship between a film forming temperature and a film forming rate of SiN and SiCN films.

As shown in FIG. 5, the plasma ALD method using DCS as the Si source gas and $NH_3$ as the nitriding agent can secure a film forming rate of 0.02 nm/min or more even though the film forming temperature is low, and is advantageous in the low-temperature film formation.

The thermal ALD method using DCS as the Si source gas and $NH_3$ as the nitriding agent can secure a practicable film forming rate of 0.06 to 0.07 nm/min when the film forming temperature is 600 degrees C. However, if the film forming temperature is decreased to 550 degrees C., the film forming rate is lowered to about 0.01 nm/min. In the thermal ALD method using DCS as the Si source gas and $NH_3$ as the nitriding agent, the SiN film is hardly formed when the film forming temperature falls below 500 degrees C. However, if HCD instead of DCS is used as the Si source gas, it is possible to prevent the film forming rate from being lowered in the low-temperature film formation.

In addition, according to the SiCN film by the film forming method according to the first embodiment, when the film forming temperature is 550 degrees C., it is possible to secure a film forming rate of 0.07 to 0.08 nm/min. Also, in a case where the film forming temperature is decreased to 450 degrees C., it is possible to secure a film forming rate of 0.05 to 0.06 nm/min. Specifically, the film forming rate in a temperature zone of not less than 200 degrees C. and not more than 550 degrees C. can be almost equally excellent to that of the plasma ALD method.

As described above, according to the film forming method according to the first embodiment, even though the plasma is not used in the low-temperature film formation, for example, in the temperature zone of not less than 200 degrees C. and not more than 550 degrees C., it is possible to secure a film forming rate equal to that of the case where the plasma is used. One of reasons is as follows.

Figure 6:
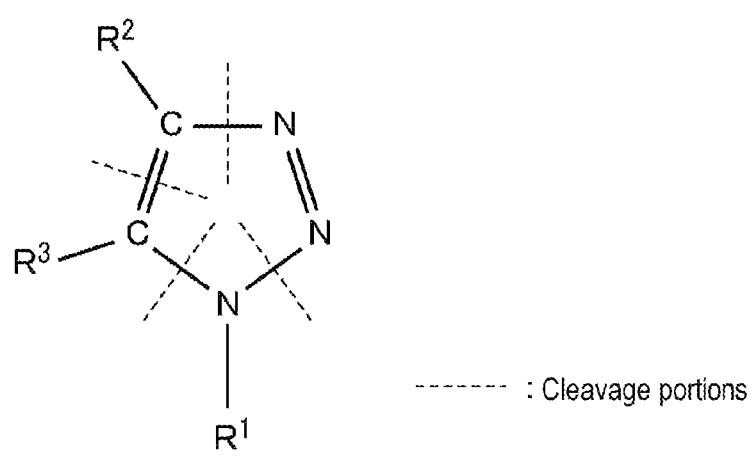
FIG. 6 illustrates a cleavage portion of a 1,2,3-triazole-based compound.

As shown in FIG. 6, the 1,2,3-triazole-based compound includes an "N═N—N" bond in a five-membered ring. In the bond, a portion "N═N" has properties where it would be decomposed to become nitrogen ($N_2$, N≡N). For this reason, unlike ordinary ring-opening cleavage, the 1,2,3-triazole-based compound has properties where cleavage/decomposition occurs at a plurality of portions. That is, an electronic unsaturated condition is created in the compound in order to generate "N≡N." A decomposition material obtained by performing cleavage/decomposition on the 1,2,3-triazole-based compound as described above is active. For this reason, it is possible to nitride an Si film and further to add C thereto even in a low film forming temperature, for example, in the temperature zone of not less than 200 degrees C. and not more than 550 degrees C.

Thus, according to the film forming method of the SiCN film according to the first embodiment, it is possible to obtain an advantage in that an SiCN film can be formed while maintaining a satisfactory film forming rate even though the film forming temperature is lowered.

Further, according to the film forming method of the SiCN film according to the first embodiment, there is another advantage in that a process of carbonizing an Si film or SiN film is not required. This is because the 1,2,3-triazole-based compound contains N and C atoms, and thus, the nitriding and addition of C can be simultaneously performed by one kind of compound in the same process. This results in improvement of throughput.

Second Embodiment

A second embodiment relates to an example of a film forming apparatus capable of performing the film forming method of the SiCN film according to the first embodiment.

Film Forming Apparatus

First Example

Figure 7:
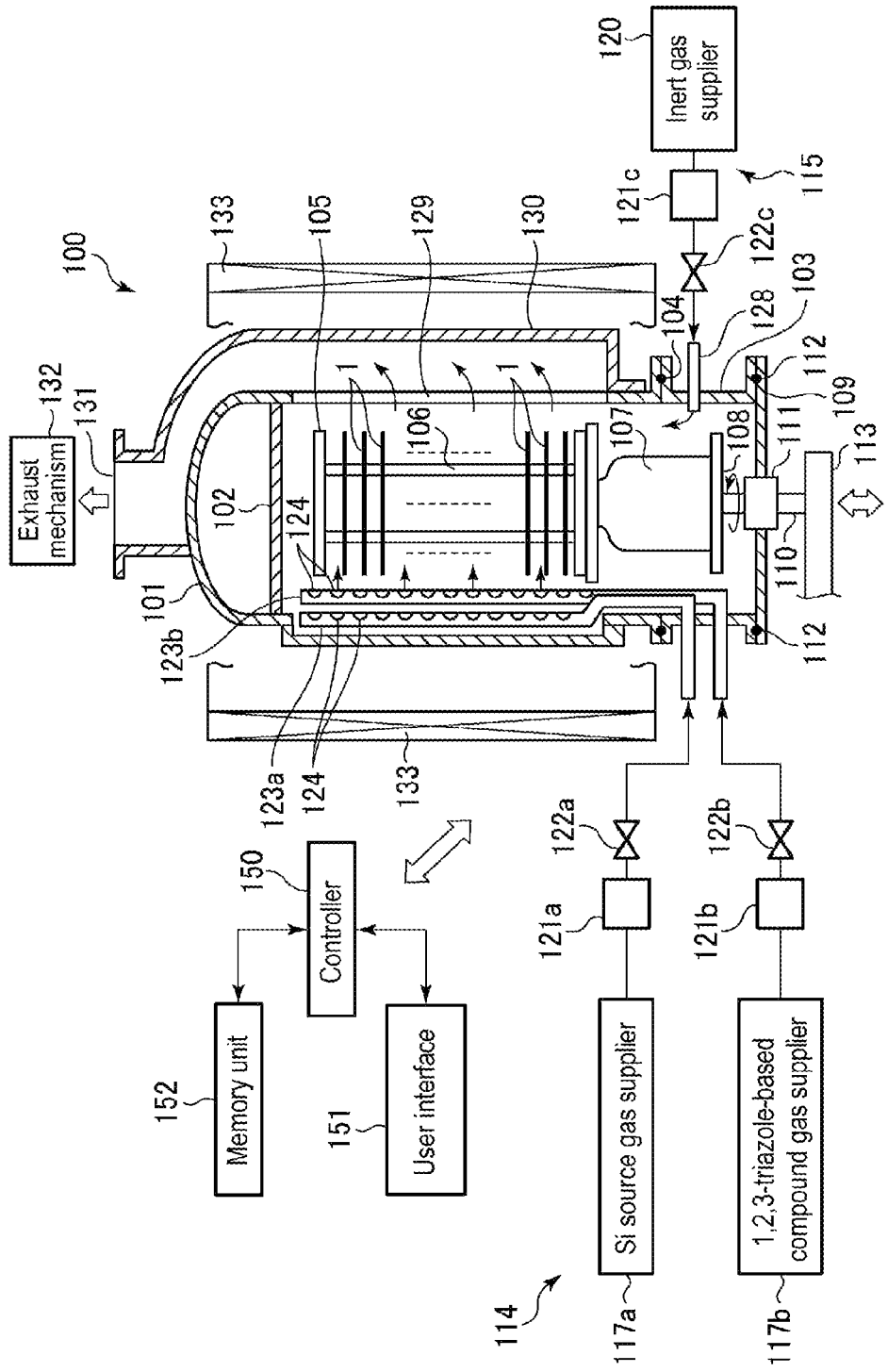
FIG. 7 is a longitudinal sectional view schematically illustrating a first example of a film forming apparatus capable of performing the film forming method of the SiCN film according to the first embodiment.

FIG. 7 is a longitudinal sectional view illustrating a first example of a film forming apparatus capable of performing the film forming method of the SiCN film according to the first embodiment.

As shown in FIG. 7, a film forming apparatus 100 has a cylindrical processing chamber 101 having an open lower end and a ceiling. The processing chamber 101 is entirely formed of, for example, quartz. A quartz ceiling plate 102 is installed in the ceiling of the processing chamber 101. In addition, a manifold 103, which, for example, is formed of stainless steel in the shape of a cylinder, is connected to the opening of the lower end of the processing chamber 101 through a sealing member 104 such as an O-ring.

The manifold 103 supports the lower end of the processing chamber 101. A wafer boat 105 made of quartz, to which a plurality of sheets, for example, 50 to 100 sheets of semiconductor substrates, i.e., wafers 1 in this example, as objects to be processed, can be loaded in a multistage manner, and can be carried into the processing chamber 101 from the bottom of the manifold 103. With this configuration, the wafers 1 are accommodated in the processing chamber 101. The wafer boat 105 has a plurality of support posts 106, and a plurality of wafers 1 is supported by grooves formed in the support posts 106.

The wafer boat 105 is loaded on a table 108 through a thermal insulation container 107 made of quartz. The table 108 is supported on a rotating shaft 110, which penetrates a lid portion 109 made of, for example, stainless steel, and configured to open and close the lower end opening of the manifold 103. The portion penetrated by the rotating shaft 110, for example, is fitted with a magnetic fluid seal 111 and airtightly seals and supports the rotating shaft 110 to be rotatable. Also, a sealing member 112 such as an O-ring is installed between a periphery of the lid portion 109 and the lower end of the manifold 103, thereby maintaining the processing chamber 101 to be sealed. The rotating shaft 110 is installed at a leading end of an arm 113 supported by a lift unit (not shown) such as a boat elevator. With this configuration, the wafer boat 105, the lid portion 109 and the like are lifted up or down together so that they are inserted into or separated from the processing chamber 101.

The film forming apparatus 100 includes a processing gas supply mechanism 114 which supplies gases used in the processing into the processing chamber 101, and an inert gas supply mechanism 115 which supplies an inert gas into the processing chamber 101. In this example, the processing gas supply mechanism 114 includes an Si source gas supplier 117a and a 1,2,3-triazole-based compound gas supplier 117b. The inert gas supply mechanism 115 includes an inert gas supplier 120.

An example of an Si source gas is HCD, and an example of a 1,2,3-triazole-based compound gas is 1H-1,2,3-triazole. An example of an inert gas is $N_2$ gas.

The Si source gas supplier 117a is connected to a distribution nozzle 123a through a flow controller 121a and an opening/closing valve 122a. Similarly, the 1,2,3-triazole-based compound gas supplier 117b is connected to a distribution nozzle 123b through a flow controller 121b and an opening/closing valve 122b.

The distribution nozzles 123a and 123b are made of quartz tubes. They penetrate through the sidewall of the manifold 103, are bent upward, and then extend vertically. In each vertical portion of the distribution nozzles 123a and 123b, a plurality of gas discharge holes 124 are formed at predetermined intervals. With this configuration, each of the gases is substantially uniformly discharged toward the inside of the processing chamber 101 through the gas discharge holes 124 in a horizontal direction.

The inert gas supplier 120 is connected to a nozzle 128 through a flow controller 121c and an opening/closing valve 122c. The nozzle 128 penetrates through the sidewall of the manifold 103 to discharge the inert gas from its leading end toward the inside of the processing chamber 101 in the horizontal direction.

In a portion of the processing chamber 101 opposite to the distribution nozzles 123a and 123b, an exhaust port 129 for exhausting the inside of the processing chamber 101 is provided. The exhaust port 129 is formed in a long and narrow shape by cutting off the sidewall of the processing chamber 101 in the vertical direction. An exhaust port cover member 130, which is formed to have a U-shaped cross-section in order to cover the exhaust port 129, is mounted to a portion corresponding to the exhaust port 129 of the processing chamber 101 by welding. The exhaust port cover member 130 extends upward along the sidewall of the processing chamber 101 and provides a gas outlet 131 at an upper portion of the processing chamber 101. An exhaust mechanism 132, including a vacuum pump or the like, is connected to the gas outlet 131. The exhaust mechanism 132 exhausts the inside of the processing chamber 101 to exhaust the processing gas used in the processing and to adjust the pressure in the processing chamber 101 to a necessary pressure as the processing progresses.

A cylindrical heating device 133 is installed at an outer periphery of the processing chamber 101. The heating device 133 activates the gas supplied into the processing chamber 101 and simultaneously heats the objects to be processed, the wafers 1 in this example, which are accommodated in the processing chamber 101.

The control of each component of the film forming apparatus 100 is performed, for example, by a controller 150 configured by a microprocessor (computer). A user interface 151, which includes a touch panel for input operation of commands and the like for an operator to control the film forming apparatus 100, a display for visualizing and displaying the operational status of the film forming apparatus 100, and the like, is connected to the controller 150.

A memory unit 152 is connected to the controller 150. The memory unit 152 stores a control program for implementing various kinds of processes performed in the film forming apparatus 100 by controlling the controller 150, or stores a program for performing the processing for the respective components of the film forming apparatus 100 according to processing conditions, i.e., a recipe. The recipe is stored, for example, in a storage medium of the memory unit 152. The storage medium may be a portable memory, such as a CD-ROM, DVD, or flash memory, as well as a hard disk or semiconductor memory. In addition, the recipe may be suitably transmitted from other units, for example, through a dedicated line. The recipe, if necessary, is read from the memory unit 152 by instructions or the like from the user interface 151 and the processing according to the read recipe is performed by the controller 150, so that the desired processing is performed in the film forming apparatus 100 under the control of the controller 150. In this example, under the control of the controller 150, the processing according to the film forming method of the SiCN film according to the first embodiment is sequentially performed.

The film forming method of the SiCN film according to the first embodiment can be performed using the film forming apparatus 100 shown in FIG. 7.

Film Forming Apparatus

Second Example

Figure 8:
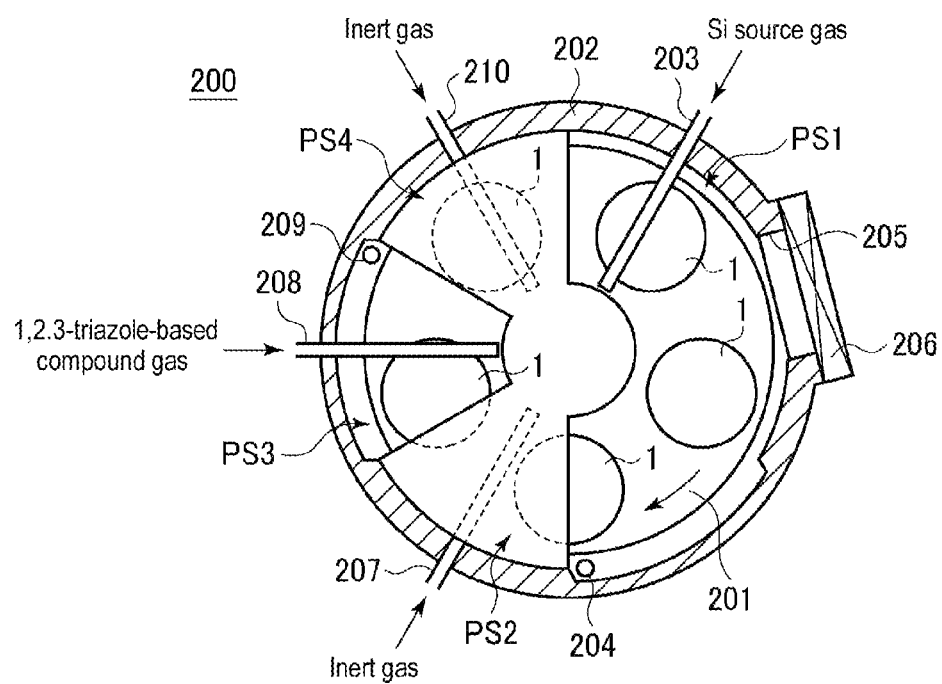
FIG. 8 is a horizontal sectional view schematically illustrating a second example of the film forming apparatus capable of performing the film forming method of the SiCN film according to the first embodiment.

FIG. 8 is a horizontal sectional view schematically illustrating a second example of the film forming apparatus capable of performing the film forming method of the SiCN film according to the first embodiment.

The film forming apparatus is not limited to the vertical batch type as shown in FIG. 7. For example, a horizontal batch type film forming apparatus as shown in FIG. 8 may be used. In FIG. 8, a horizontal cross section of a processing chamber of the horizontal batch type film forming apparatus 200 is schematically illustrated. Also, in FIG. 8, the illustration of a processing gas supply mechanism, an inert gas supply mechanism, an exhaust device, a heating device, a controller and the like are omitted.

As shown in FIG. 8, in the film forming apparatus 200, five wafers 1, for example, are mounted on a turntable 201 and are subjected to a film forming process. The turntable 201 rotates, for example, in the clockwise direction, with the wafers 1 mounted thereon. The processing chamber 202 of the film forming apparatus 200 is divided into four processing stages. Thus, as the turntable 201 rotates, a wafer 1 passes through the four processing stages in order.

A first processing stage PS1 is a stage in which Step S1 shown in FIG. 1 is performed. That is, in the processing stage PS1, an Si source gas is supplied onto a surface to be processed of the wafer 1. A gas supply pipe 203 for supplying the Si source gas is disposed above the processing stage PS1. The gas supply pipe 203 supplies the Si source gas onto the surface to be processed of the wafer 1 which is mounted on the turntable 201 and comes back thereto. An exhaust port 204 is installed at a downstream side of the processing stage PS1.

The processing stage PS1 may also be a loading/unloading stage for loading and unloading the wafers 1 into and from the processing chamber 202. The wafers 1 are loaded into and unloaded from the processing chamber 202 through a wafer loading/unloading port 205. The wafer loading/unloading port 205 is opened and closed by a gate valve 206. The next stage of the processing stage PS1 is a processing stage PS2.

The processing stage PS2 is a stage in which Step S2 shown in FIG. 1 is performed. The processing stage PS2 has a space with a narrow width, and the wafer 1 passes through the space while being mounted on the turntable 201. An inert gas is supplied into the space from a gas supply pipe 207. The next stage of the processing stage PS2 is a processing stage PS3.

The processing stage PS3 is a stage in which Step S3 shown in FIG. 1 is performed. A gas supply pipe 208 is disposed above the processing stage PS3. The gas supply pipe 208 supplies a 1,2,3-triazole-based compound gas onto the surface to be processed of the wafer 1 mounted on the turntable 201 and comes back thereto. An exhaust port 209 is installed at a downstream side of the processing stage PS3. The next stage of the processing stage PS3 is a processing stage PS4.

The processing stage PS4 is a stage in which Step S4 shown in FIG. 1 is performed. In the same manner as the processing stage PS2, the processing stage PS4 has a space with a narrow width, and the wafer 1 passes through the space while being mounted on the turntable 201. An inert gas is supplied into the space from a gas supply pipe 210. The next stage of the processing stage PS4 is the processing stage PS1 that is the initial stage.

In the film forming apparatus 200 configured as described above, if the wafer 1 turns a full circle, Steps S1 to S4 shown in FIG. 1 are completed. The wafer 1 is turned up to a predetermined number of times while being mounted on the turntable 201, so that an SiCN film is formed on the surface to be processed of the wafer 1.

The film forming method of the SiCN film according to the first embodiment of the present disclosure can be performed using the film forming apparatus 200 shown in FIG. 8.

In the embodiments, the processing conditions have been specifically illustrated in the above embodiments, but the processing conditions are not limited to the specific examples. For example, a flow rate or the like of a gas is appropriately adjusted depending on a volume of the processing chamber.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a SiCN film on a surface to be processed of an object to be processed, the method comprising performing a cycle which includes:
   supplying a Si source gas containing an Si source into a processing chamber having the object to be processed accommodated therein so as to form a Si film on the object to be processed;
   purging the inside of the processing chamber;
   supplying a gas containing a nitriding agent into the processing chamber so as to modify the Si film into a SiCN film; and
   purging the inside of the processing chamber,
   wherein the cycle is repeated until a thickness of the SiCN film reaches a desired thickness, and
   wherein a compound of nitrogen and carbon, which is represented by the following Chemical Formula 1, is used as the nitriding agent:

[Chemical Formula 1]

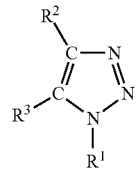

(1)

wherein $R^1$, $R^2$ and $R^3$ are linear or branched alkyl groups having 1 to 8 carbon atoms, which include hydrogen atoms or substituents.

2. The method of claim 1, wherein the substituent of $R^1$, $R^2$ or $R^3$ is a monoalkylamino or dialkylamino group substituted with a linear or branched alkyl group having 1 to 4 carbon atoms.

3. The method of claim 1, wherein the substituent of $R^1$, $R^2$ or $R^3$ is a linear or branched alkoxy group having 1 to 8 carbon atoms.

4. The method of claim 1, wherein the compound represented by Chemical Formula 1 is 1H-1,2,3-triazole, 1-methyl-1,2,3-triazole, 1,4-dimethyl-1,2,3-triazole, 1,4,5-trimethyl-1,2,3-triazole, 1-ethyle-1,2,3-triazole, 1,4-diethyl-1,2,3-triazole or 1,4,5-triethyl-1,2,3-triazole.

5. The method of claim 1, wherein supplying the gas containing the nitriding agent into the processing chamber is performed without using plasma.

6. The method of claim 1, wherein the film forming temperature of the SiCN film is not less than 200 degrees C. and not more than 550 degrees C.

* * * * *